United States Patent [19]
Ganapathy

[11] Patent Number: 5,450,418
[45] Date of Patent: Sep. 12, 1995

[54] PSEUDO MASTER SLAVE CAPTURE MECHANISM FOR SCAN ELEMENTS

[75] Inventor: Gopi Ganapathy, Austin, Tex.

[73] Assignee: Advanced Micro Devices, Inc., Austin, Tex.

[21] Appl. No.: 995,754

[22] Filed: Dec. 23, 1992

[51] Int. Cl.$^6$ .......................................... G01R 31/3183
[52] U.S. Cl. ...................... 371/24; 371/22.3; 371/25.1; 371/27; 364/490
[58] Field of Search ................ 371/22.3, 23, 24, 25.1, 371/27; 364/490

[56] References Cited

U.S. PATENT DOCUMENTS

| | | | |
|---|---|---|---|
| 4,074,851 | 2/1978 | Eichelberger et al. | 371/22.3 |
| 5,210,759 | 5/1993 | DeWitt et al. | 371/22.3 |
| 5,252,917 | 10/1993 | Kadowaki | 371/22.3 |
| 5,271,019 | 12/1993 | Edwards et al. | 371/22.3 |

OTHER PUBLICATIONS

Gallup et al., "Testability Features of the 68040", Paper 33.2, pp. 749, 754–755, 1990 International Test Conference.
International Test Conference Proceedings, 1–3 Sep. 1987, Washington US, pp. 460–470, M. J. Ohletz et al. 'Overhead in Scan and Self-Testing Designs'.
IBM Technical Disclosure Bulletin, vol. 23, No. 4, Sep. 1980 New York US, pp. 1504–1505, 'Use of Independent Error Detection Systems for Field Replaceable Units'.
IBM Technical Disclosure Bulletin, vol. 32, No. 5A, Oct. 1989, New York US, pp. 432–434, 'Scanning SRL's Containing L2 Latches Without Losing Data'.

Primary Examiner—Emanuel T. Voeltz
Assistant Examiner—Thomas Peeso
Attorney, Agent, or Firm—Foley & Lardner

[57] ABSTRACT

A test circuit and test technique for scan testing integrated circuits includes scan cells or capture scan elements arranged in a pseudo master slave configuration. The testing technique utilizes a first independent scan cell as a master stage and a second independent scan cell as a slave stage for propagating data through the IC. The test circuit and test techniques are highly advantageous because of minimal structural overhead. However, the scan cells must be loaded twice to recover the test data because half of the test data is lost when the data is propagated through the IC. The shift register inputs of one scan cell are generally coupled to shift register outputs of other scan cells. Each scan cell generally only includes one latch element.

11 Claims, 2 Drawing Sheets

PSEUDO MASTER SLAVE CAPTURE MECHANISM FOR SCAN ELEMENTS

CROSS REFERENCE TO RELATED APPLICATIONS

The present application is related to copending application Ser. No. 07/980,670, now abandoned entitled "Full Scan Optimization Technique Using Drive One/Drive Zero Elements and Multiple Capture Clocking", invented by Ganapathy et al., filed on Nov. 24, 1992.

1. Field of the Invention

This invention relates to the field of test circuits and test techniques for integrated circuits (ICs) and, in particular, to scan testing elements used in the testing of microprocessors, RISC microprocessors and other ICs which include sequential elements.

2. Background of the Invention

After manufacturing an electronic chip or IC, the IC must be tested to ensure that it operates properly. Scan testing is an efficient method for determining which portions of an IC are working properly. Generally, ICs are tested by providing particular inputs to the IC and analyzing the outputs from the IC. If the IC provides the proper outputs to the particular inputs, the manufacturer is assured that the IC is working properly.

Certain faults or defects in an IC are difficult to determine because they are not directly detectable or visible from any output pins. Scan testing is a test technique which provides visibility to interior circuitry of an IC. Scan testing isolates portions of an IC by providing input test data or vectors designed to analyze predetermined portions of an IC and receiving test data which reveal defects in the interior circuitry of an IC.

Testing may be economically implemented on non-sequential or combinatorial ICs. However, when such an IC includes sequential elements such as latches, flip-flops, or other state devices, testing becomes very difficult. Sequential elements include any device in which the output of the device is dependent on the particular state of the device. ICs which may include sequential elements are microprocessors, input/output processors, peripheral controllers, or the like. Such sequential devices are thus very difficult to test because the states of the devices which are internal to the IC are not readily apparent and may not be readily loaded.

In order to facilitate testing of ICs such as microprocessor ICs which utilize sequential elements, scan cells are placed in the IC. The scan cells generally appear transparent when the IC is in normal operation or system mode. When the IC is in the test mode, the scan cells perform the function of the sequential elements they replace and generally may be loaded with particular data. Further, the scan cells may load data or capture data associated with the sequential elements. The scan cells may operate similar to shift registers and propagate or transmit the captured or loaded data into and out of the IC. Some scan cells are solely dedicated to capture data, while others are solely dedicated to load data. The data provided to the external pins by the scan cells facilitates the scan testing analysis.

A large number of scan cells are required for scan testing of microprocessor IC's and the like. Hence, there is a need to minimize the area overhead due to these scan cells. The smallest scan cells in prior art are based on latches which generally rely on master/slave configurations to shift data into and out of the scan cells. In this typical prior art configuration, each scan cell includes a master stage and a slave stage. The master stage is clocked by a Master pulse, and the slave stage is clocked by a Test Slave pulse. The outputs of the slave stages are coupled to the inputs of the master stages on the next scan cell.

The master and slave stage implementation allows data to be preserved as it is clocked from a first scan cell to a second scan cell. For example, if the master stage of the first scan cell stores a logic 1, and the master stage of the second scan cell stores a logic 0, a Test Master clock pulse causes the master stage of the first scan cell to transmit the stored logic 1 to the slave stage and the master stage of the second scan cell to transmit the stored logic 0 to the slave stage. If a Test Slave clock pulse is then provided to the first and second scan cell, the slave stage of the first scan cell transmits the logic 1 to the master stage of the second scan cell and the slave stage of the second scan cell transmits the logic 0 to a third scan cell, an external pin or other output. In this way, data is propagated through the prior art scan cells for eventual transmission to an external pin.

With this implementation, the prior art scan cells may operate similar to shift registers and propagate the captured data to outputs on the IC in response to Test Master and Test Slave clock inputs. Therefore, data is not lost as it is transmitted from scan cell to scan cell because the master or slave stage stores the data associated with the scan cell after each Test Slave or Test Master clock pulse. These scan cells, however, are disadvantageous because they add transistors to the integrated circuit. Further, these scan cells require that two test clock signal inputs be coupled to each scan cell. Thus, the prior art scan cells are a detriment to the cost, size and speed of the ICs.

SUMMARY OF THE INVENTION

The present invention provides an integrated circuit including a first independent latch and a second independent latch. The first independent latch includes a first latch element coupled to a first latch output and a first shift mechanism. The first shift mechanism is coupled to the first latch element and includes a first shift input and a first test clock input. Data at the first shift input is provided to the first latch element when a first test clock signal is provided at the first test clock input. The second independent latch includes a second latch element coupled to a second data input and a second shift mechanism. The second shift mechanism is coupled to the second latch element and includes a second shift input coupled to the first shift output, and a second test clock input. The data at the second shift input is provided to the second latch element when a second test clock signal is provided at the second test clock input.

The present invention also provides a scan capture element for use in an integrated circuit. The scan capture element includes a shift register input, a shift register output, a test clock input which receives a test clock signal, and a latch. The latch comprises a first transfer gate and essentially a single latch element. The latch element includes a latch element input and a latch element output. The latch element output is coupled to the shift register output, and the latch element input is coupled to the first transfer gate. The first transfer gate is coupled to the shift register input and allows data at the first shift register input to be transmitted to the latch element input when the test clock signal is present at the test clock input.

The present invention also provides an array of sequential circuit elements in an integrated circuit. Each sequential element includes latch means for storing data and shift means for propagating the stored data. The shift means includes a shift input and a shift output. The shift means of the sequential elements in the array are intercoupled so that the shift input of one sequential element is coupled to the shift output of another sequential element. Each of the shift means is alternately controlled by a Test Master and Test Slave clock signal.

The present invention also provides an integrated circuit including logic elements. The integrated circuit includes a first sequential element and a second sequential element. The first sequential element includes a first data input coupled to at least one output of at least one of the logic elements, a first shift input, and a first storage means for storing data at the first shift input in response to a first test signal. The first storage means also stores data at the first data input in response to a system clock signal and provides the stored data at a first data output. The second sequential element includes a second data input coupled to one output of at least one of the logic elements, a second shift data input, and a second storage means for storing data at the second shift input in response to a second test signal. The second storage means also stores data at the second data input in response to a system clock signal. The second storage means provides the stored data at a second data output. The first shift input is coupled to the second data output.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several Figures of which like reference numerals indicate identical elements, and wherein:

DETAILED DESCRIPTION OF PREFERRED EXEMPLARY EMBODIMENT OF THE PRESENT INVENTION

Figure 1:
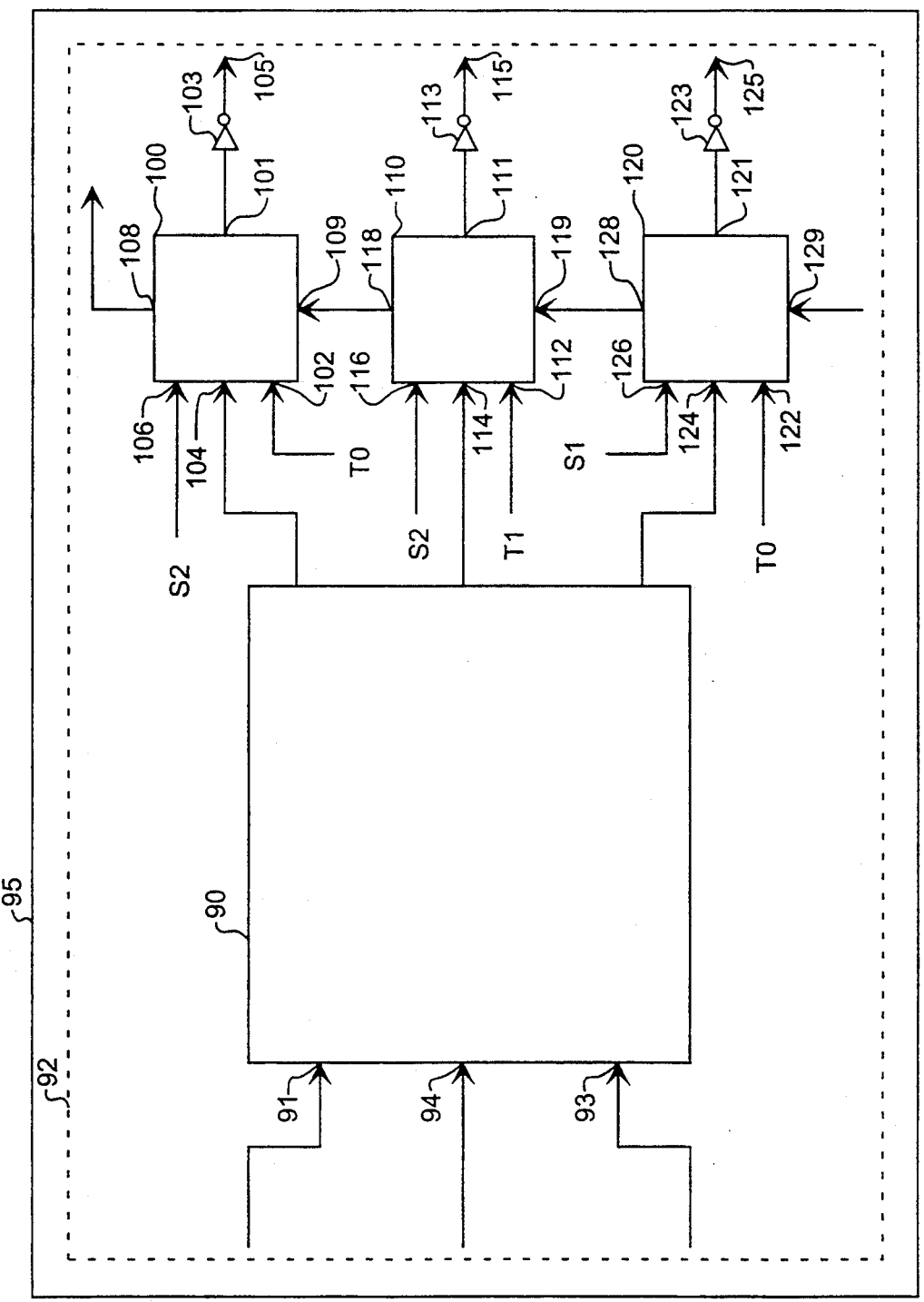
FIG. 1 is a schematic block diagram of an integrated circuit embodying the present invention configured for the testing of sequential elements therein including scan cells in accordance with the present invention.

FIG. 1 is a schematic block diagram of a circuit portion 92 of an integrated circuit 95 embodying the present invention configured for the testing of sequential elements therein in accordance with the present invention. The circuit portion 92 includes a combinatorial element 90, an input 91, an input 94, an input 93, a scan cell 100, a scan cell 110 and a scan cell 120. Scan elements or scan cells 100, 110, and 120 are each independent sequential elements which operate as single latches in the system mode (during normal operation of the IC).

Combinatorial element 90 is circuitry representative of AND gates, OR gates, NAND gates, inverters or other logic elements or combinations thereof which are utilized in integrated circuits. The inputs 91, 94 and 93 may be coupled to external pins or to other circuitry within the portion 92 or within the integrated circuit 95.

The scan cell 100 includes a data output 101, a Test Master clock input 102, a data input 104, a system clock input 106, a shift register input 109, and a shift register output 108. An inverter 103 is coupled to the scan cell 100 between the data output 101 and an output 105. The output 105, an output 115 and an output 125 may be coupled to an external pin or other circuitry within the integrated circuit 95. The shift register output 108 may be coupled to an external pin or a shift register input of another scan cell (not shown).

The clock input 102 is coupled to receive a Test Master clock signal. The Test Master clock signal and Test Slave clock signal are preferably test clock signals such as internal microprocessor test clock signals which are well known in the art. The Test Master and Test Slave clock signals are preferably 180° out of phase from each other. The system clock input 106 receives a $\phi 2$ clock signal. The $\phi 1$ and $\phi 2$ clock signals are preferably system clock signals 180° out of phase from each other such as internal microprocessor clock signals which are well known in the art.

The scan cell 110 includes a data output 111, a Test Master clock input 112, a data input 114, a system clock input 116, a shift register input 119, and a shift register output 118. An inverter 113 is coupled to the scan cell 110 between the data output 111 and the output 115. The clock input 112 is coupled to receive a Test Slave clock signal. The system clock input 116 receives a $\phi 2$ clock signal. Alternatively, clock inputs 106, 116, and 126 can receive any phase of system clock $\phi 1$, or $\phi 2$.

The scan cell 120 includes a data output 121, a Test Master clock input 122, a data input 124, a system clock input 126, a shift register input 119, and a shift register output 128. An inverter 123 is coupled to the scan cell 120 between the data output 121 and the output 125. Alternatively, the outputs 105, 115 and 125 may be coupled directly to the data outputs 101, 111, and 121 respectively. The shift register input 129 may be coupled to an external pin, other circuitry within the IC 95 or a shift register output of another scan cell (not shown). The shift register output 128 is coupled to the shift register input 119, and the shift register output 118 is coupled to the shift register input 109.

When the IC 95 is in normal operation, scan cells 100, 110 and 120 operate as independent sequential elements. Particularly, scan cells 100, 110 and 121 operate as latches. Data from the combinatorial element 90 is provided to data inputs 104, 114, and 124. The scan cell 100 stores an inverted form of the data at input 104 in response to a $\phi 2$ clock pulse at the input 106. The inverted stored data is provided to the data output 101.

The inverter 103 reinverts the data, and provides the data to the output 105. The scan cell 110 operates similarly to the scan cell 100 except that the data is received at the data input 114 and transmitted from the data output 111 to an inverter 113. The inverter 113 provides the reinverted data to the output 115.

The scan cell 120 receives the data from the circuit element 90 at the data input 124. The scan cell 120 stores an inverted form of the data in response to a $\phi 1$ clock pulse at the system clock input 126. The stored inverted data is provided at the data output 121. The inverter 123 reinverts the data and provides the data at the output 125. Therefore, the scan cells 100, 110, and 120 provide a latch function controlled by the system clock signals $\phi 1$ and $\phi 2$ when in the normal mode of operation.

In order to test the portion 92 of the IC 95, Test Master and Test Slave test clock signals are provided to the scan cells 100, 110 and 120. Data is loaded into the scan cells as discussed above by using the $\phi 1$ and $\phi 2$ system clock signals to capture data at the data inputs 91, 92 and 93. The stored data may then be shifted through the shift register inputs 129, 119, and 109 and shift register outputs 128, 118, and 108 for eventual transmission to an external pin (not shown).

Data at the shift register input 129 is loaded into the scan cell 120 in response to a Test Master clock pulse at the test clock input 122. The data is stored in an inverted form in the scan cell 120. In response to the same Test Master clock pulse at the test clock input 102, the scan cell 100 receives the data at the shift register output 118 and shift register input 109. The scan cell 100 stores the data in an inverted form. Any data previously stored in the scan cells 100 and 120 will be destroyed or lost when the scan cells receive new data in response to the Test Master clock pulse. The data in the scan cell 110 remains unchanged in response to the Test Master clock pulse.

The data stored in the scan cell 120 may then be shifted into the scan cell 110 when a Test Slave clock pulse is provided at the test clock input 112 of the scan cell 110. Data previously stored in the scan cell 110 is destroyed or lost when the data from the scan cell 120 is shifted into scan cell 110. The scan cell 110 stores data in an inverted form.

The data stored in the scan cell 110 may be shifted to the scan cell 100 when a Test Master clock pulse is provided to the test clock input 102. This process of shifting data through the scan cells 100, 110 and 120 is continued until all the necessary test data is provided at an external pin or pins. However, only the data originally stored in every other scan cell 110, 120 and 130 may be propagated to the external pin because one-half of the data is lost or destroyed during propagation.

For example, if the scan cells 100, 110 and 120 capture a logic 1, a logic 0 and a logic 1, respectively, and the shift register input 129 is a logic 1, a form of the logic 0 is stored in the scan cell 110 and a form of the logic 1 at the shift register input 129 is propagated to the shift register output 108 responsive to a Test Master clock pulse followed by a Test Slave clock pulse followed by a Test Master clock pulse. Particularly, in response to the first Test Master clock pulse, the logic 1 at the shift register input 129 is stored in the scan cell 120 as a logic 0 and the logic 0 stored in the scan cell 110 which is provided at the shift register output 118 is stored in the scan cell 100 as a logic 1. The stored logic 1 in the scan cell 100 is provided at the shift register output 108. The data originally stored in scan cells 100 and 120 is destroyed by this propagation of data.

In response to a Test Slave clock pulse, the logic 0 stored in the scan cell 120 is shifted to the scan cell 110 as a logic 1. The scan cell 100 continues to store the logic 1 and provide the logic 1 at the shift register output 108. In response to the second Test Master clock pulse, the scan cell 120 stores an unknown logic level at the shift register output 129 and the scan cell 110 continues to store a logic 1. Also, the scan cell 100 stores the logic 1 in the scan cell 110 as a logic 0. This logic 0 is output at the shift register output 108. Thus, the logic 0 originally stored in the scan cell 110 is provided as a logic 1 to the shift register output 108 after the first Test Master clock pulse and the logic 1 at the shift register input 129 is provided to the shift register output 108 as a logic 0 after the second Test Master clock pulse.

In order to propagate the data originally stored in the scan cells 100 and 120 to the shift register output 108, the scan cells 100, 110 and 120 are reloaded with the logic 1, 0, and 1 respectively. Once reloaded, the Test Slave clock pulse followed by the Test Master clock pulse is provided to the clock input 122 and clock inputs 102 and 122, respectively, in order to propagate the data to the shift register output 108.

Particularly, in response to the Test Slave clock pulse, the logic 1 stored in the scan cell 120 is shifted to the scan cell 110 and stored as a logic 0. Scan cells 100 and 120 continue to store logic 1s. Thus, the shift register output 108 is provided a logic 1 after the Test Slave clock pulse.

In response to the Test Master clock pulse, the scan cell 100 stores the logic 0 in the scan cell 110 as a logic 1. This logic 1 is provided to the shift register output 108. Therefore, the logic 1 in the scan cell 120 is output at the shift register 108 after a Test Slave clock pulse followed by a Test Master clock pulse.

Therefore, the scan cells 100, 110 and 120 advantageously operate as pseudo master slave scan cells which may shift data out of the integrated circuit 95 by alternatively providing Test Slave and Test Master clock pulses. Although data in every other scan cell is lost or destroyed under this scheme, scan cells 100, 110 and 120 are advantageous because they utilize fewer transistors. Further, the destroyed data may be recovered by reloading the scan cells 100, 110 and 120 and providing test clock pulses in the opposite order. The test time required to shift the data out of the portion 92 is the same as other prior art systems which utilize traditional master slave configurations except that an extra capture pulse is required to reload the scan cells after the first set of test data is output from the IC 95.

Figure 2:
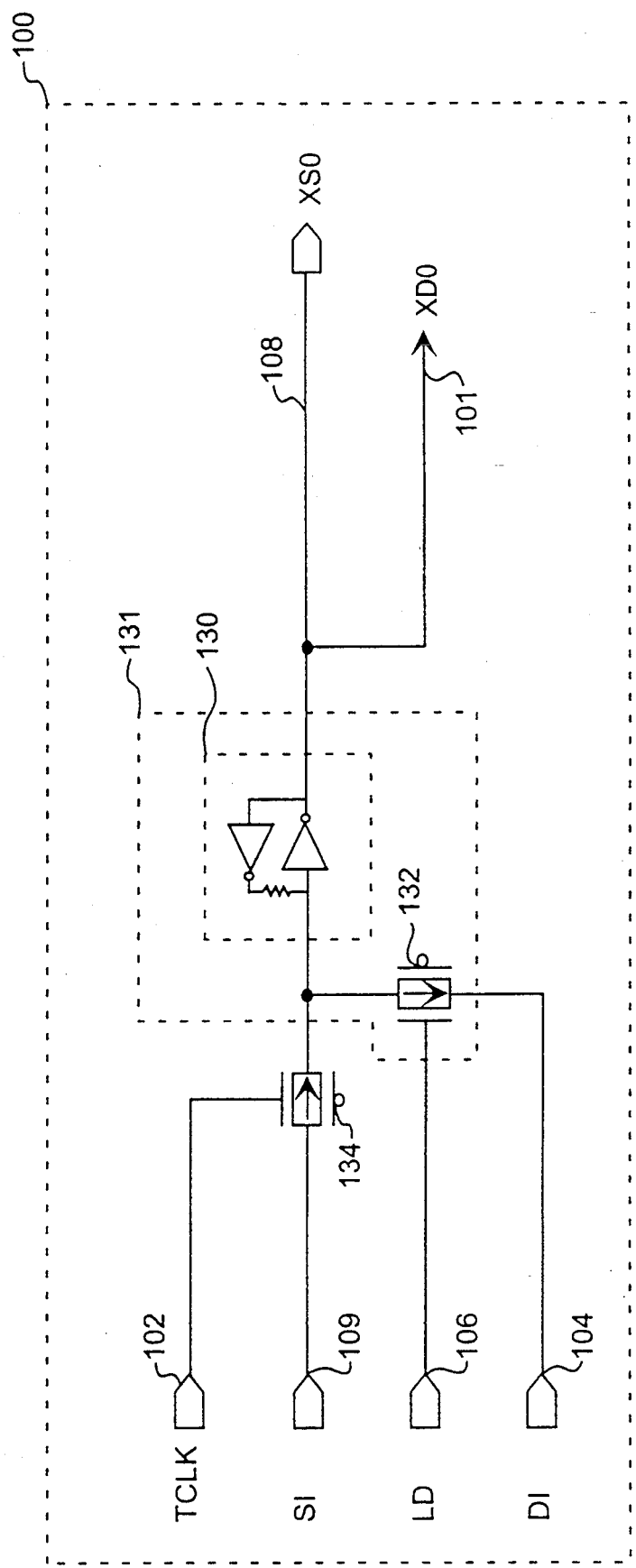
FIG. 2 is a schematic diagram of a scan cell configured in accordance with a preferred exemplary embodiment of the present invention.

Referring now to FIG. 2, it illustrates the capture scan cell 100 of FIG. 1 for practicing the present invention in accordance with this preferred embodiment. The capture scan cell 100 uses fewer transistors because a slave stage is not necessary as discussed with reference to FIG. 1. The scan cell 100 can advantageously reduce the overhead by nearly 30-40% because the slave stage can be eliminated from the structure. The capture scan cell 100 is also representative of the capture scan cells 110 and 120. The capture scan cell 100 includes a latch portion 131 and a shift mechanism or circuit including the test clock input 102, the shift register input 109, the pass-through gate or transfer gate 134 and the shift register output 108.

The latch portion 131 includes a latch element 130, and a transfer gate 132. The latch element 130 is an inverter-to-inverter structure or latch gate as is well known in the art. A transfer gate is a device which allows data at its input to be applied to its output in response to a control signal. Transfer gates 134 and 132 generally include built-in inverters coupled across the inverted and non-inverted control inputs. The latching element or latching gate 130 has a feedback mechanism to store logic values.

A system clock input 106 is coupled to a control input on the transfer gate 132 and a data input 104 is coupled to an input on the transfer gate 132. An output on the transfer gate 132 is coupled to an input on the latch element 130. The input of the latch element 130 is also coupled to the output of the transfer gate 134. The input of the transfer gate 134 is coupled to the shift register input 109. The control input of the transfer gate 134 is coupled to the test clock input 102. The output of the latch element 130 is coupled to the shift register output 108 and a data output 101.

In operation, data from the combinatorial element 90 (FIG. 1) is provided to the scan cell 100 by the data input 104. The data at the data input 104 is provided to the latch element 130 when a logic high is provided at the system clock input 106. More particularly, when the $\phi 2$ clock pulse is provided at the system clock input 106, the transfer gate 132 provides the data at the data input 104 to the latch element 130. The latch element 130 inverts the data provides a signal to the shift register output 108 and the data output 101.

The latch element 130 may also receive data from the shift register input 109. When the signal at the test clock input 102 is a logic high, the transfer gate 134 allows data to be transferred from the shift register input 109 to the latch element 130. The latch element 130 inverts the data and provides the data to the shift register output 108 and the data output 101.

It will be understood that while the various conductors/connectors may be depicted in the drawing as single lines, they are not shown in a limiting sense as understood in the art. Further, the above description is of a preferred exemplary embodiment of the present invention, and the invention is not limited to the specific forms shown. In addition, although only a portion of various ICs have been shown, the invention may be advantageously employed in various different types of ICs such as RISC microprocessors, registers, caches, or in any other ICs where testing of integral digital circuitry is required. Further still, although particular signals are inverted, logic LOW or logic HIGH, the circuit may be modified to accommodate various logic signals. Further, the scan cells may be employed to replace any sequential or logic element. These and other modifications may be made in the design and arrangements of the elements discussed herein without departing from the scope of the invention as expressed in the appended claims.

I claim:

1. A method for testing an integrated circuit, the integrated circuit including an array of scan latches, the array having a first scan latch controlled by a first test clock signal, a second scan latch controlled by a second test clock signal, and a third scan latch controlled by the first test clock signal, the second scan latch being coupled between the first and third scan latches, the method comprising the steps of:

loading a data pattern comprised of a first bit, a second bit and a third bit, the first and third bits being loaded into the first and third scan latches, respectively, and the second bit being loaded into the second scan latch;

applying the first clock signal to the first and third scan latches so that the first scan latch stores the second bit and the first and third bits are eliminated;

retrieving the second bit from the first latch;

reloading the data pattern comprised of the first bit, the second bit and the third bit, the first and third bits being loaded into the first and third scan latches, and the second bit being loaded into the second scan latch;

applying the second clock signal to the second scan latch so that the second scan latch stores the third bit and the second bit is eliminated;

applying the first clock signal to the first and third scan latches so that the first scan latch stores the third bit and the first bit is eliminated;

retrieving the third bit from the first latch.

2. The method of claim 1, further comprising the step of:

comparing the second and third bit to a test data pattern.

3. The method of claim 1 further comprising the step of retrieving the first bit from the first latch before providing the first clock signal.

4. The method of 3 wherein the integrated circuit further comprises an external pin coupled to the first scan latch and the steps of retrieving includes monitoring the signal on the external pin.

5. The method of claim 1 wherein the scan latches operate as old type latches when the integrated circuit is in a normal mode of operation.

6. The method of claim 1 whereby the array is a pseudo master slave scan latch array utilizing fewer transistors than traditional master slave scan latches.

7. An integrated circuit including an array of scan latches, the array comprising:

a first scan latch, the first scan latch having a first test clock input, a first shift register output, a first shift register input, and a first latch storage element, the first latch storage element coupled between the first shift register input and the first shift register output;

a second scan latch having a second test clock input, a second shift register output, a second shift register input, and a second latch storage element, the second latch storage element coupled between the second shift register input and the second shift register output; and a third scan latch having a third test clock input, a third shift register output, a third shift register input, and a third latch storage element, the third latch storage element coupled between the third shift register input and the third shift register output, the first clock input being coupled to the third clock input, wherein the first shift register input is coupled to the second shift register output and the third shift register output is coupled to the second shift register input wherein first data stored in the third latch storage element is propagated to the first latch storage element by providing a first shift signal at the second clock input followed by a second shift signal at the first and third clock input.

8. The integrated circuit of claim 7 wherein second data stored in the second latch storage element is destroyed as the first data is propagated.

9. The integrated circuit of claim 7 wherein the scan latches include a capture data input and a capture clock input, wherein the first data is loaded in the third latch storage element.

10. The integrated circuit of claim 7 wherein each scan latch consists of essentially a single latch storage element.

11. The integrated circuit of claim 10 wherin the scan latches are arranged in a pseudo master slave configuration.

* * * * *

UNITED STATES PATENT AND TRADEMARK OFFICE
CERTIFICATE OF CORRECTION

PATENT NO. : 5,450,418
DATED : Sep. 12, 1995
INVENTOR(S) : Ganapathy

It is certified that error appears in the above-indentified patent and that said Letters Patent is hereby corrected as shown below:

Column 8, line 56,

In claim 9, line 1, change "claim 7" to --claim 8--.

Line 59,

In claim 9, line 4, after "element" insert --when a capture clock signal is provided at the capture clock input of the third scan latch and the first data is provided at the capture data input of the third scan latch--.

Line 60,

In claim 10, line 1, change "claim 7" to --claim 8--.

Line 63,

In claim 11, line 1, change "wherin" to --wherein--.

Signed and Sealed this

Thirteenth Day of August, 1996

*Attest:*

BRUCE LEHMAN

*Attesting Officer*  *Commissioner of Patents and Trademarks*